(12) United States Patent
Olson et al.

(10) Patent No.: US 6,376,391 B1
(45) Date of Patent: *Apr. 23, 2002

(54) PULSED OR TAILORED BIAS FOR FILLING GAPS WITH LOW DIELECTRIC CONSTANT MATERIAL

(76) Inventors: Darin Scott Olson, 29 Lorelei La., Menlo Park, CA (US) 94025; Tirunelveli Subramamam Ravi, 4243 Verdigris Cir., San Jose, CA (US) 95134

( * ) Notice: Subject to any disclaimer, the term of this patent is extended or adjusted under 35 U.S.C. 154(b) by 0 days.

This patent is subject to a terminal disclaimer.

(21) Appl. No.: 09/475,477

(22) Filed: Dec. 30, 1999

(51) Int. Cl.⁷ .................................. H01L 21/31
(52) U.S. Cl. .................. 438/758; 438/778; 438/780; 438/787; 438/788; 438/789
(58) Field of Search .................. 438/778, 780, 438/783, 787, 788, 789, 790, 758, 784, 763, 689; 427/255.7, 579

(56) References Cited

U.S. PATENT DOCUMENTS

| | | | | |
|---|---|---|---|---|
| 5,028,566 A | * | 7/1991 | Lagendijk | 437/238 |
| 5,605,599 A | * | 2/1997 | Benzing et al. | 156/643.1 |
| 5,723,386 A | * | 3/1998 | Ishikawa | 438/787 |
| 6,068,884 A | * | 3/2000 | Rose et al. | 427/255.6 |
| 6,136,685 A | * | 10/2000 | Narwankar et al. | 438/761 |

* cited by examiner

Primary Examiner—Benjamin L. Utech
Assistant Examiner—DuyVu Deo
(74) Attorney, Agent, or Firm—Thomas Swenson; Lathrop & Gage, L.C.

(57) ABSTRACT

A variable high frequency rf bias is applied to a substrate during a high density plasma CVD process for filling gaps in integrated circuits with low dielectric material. The rf bias is varied by applying it as a pulse or by tailoring the magnitude of the rf bias. Preferably, a gasified organic precursor compound comprising silicon, oxygen and carbon atoms is flowed into the plasma CVD reaction chamber. Preferably, no reactive oxygen gas is used in the reaction chamber.

29 Claims, 5 Drawing Sheets

PULSED OR TAILORED BIAS FOR FILLING GAPS WITH LOW DIELECTRIC CONSTANT MATERIAL

BACKGROUND OF THE INVENTION

1. Field of the Invention

The invention relates to a method for filling gaps in integrated circuits with low dielectric constant material by varying the rf bias applied to a substrate in a high density plasma chemical vapor deposition process.

2. Statement of the Problem

As semiconductor technology advances, circuit elements and interconnections on wafers or silicon substrates become increasingly more dense. As a result of the continuing trend toward higher device densities, parasitic interdevice currents are increasingly problematic. In order to prevent unwanted interactions between these circuit elements, insulator-filled gaps, or trenches, located between active circuit devices and metallized interconnect layers are provided to physically and electrically isolate the elements and conductive lines. However, as circuit densities continue to increase, the widths of these gaps decrease, thereby increasing gap aspect ratios, typically defined as the gap depth divided by the gap width. As the gaps become narrower, parasitic capacitance increases, and filling the gaps with insulating material becomes more difficult, and this can lead to unwanted voids and discontinuities in the insulating, or gapfill, material.

For example, in metal-oxide-semiconductor ("MOS") technology, it is necessary to provide an isolation structure that prevents parasitic channel formation between adjacent devices, such devices being primarily NMOS and PMOS transistors or CMOS circuits. Trench isolation technology has been developed in part to satisfy such insulation needs. Refilled trench structures essentially comprise a recess formed in the silicon substrate that is refilled with a dielectric insulating material. Such structures are fabricated by first forming submicron-sized trenches in the silicon substrate, usually by a dry anisotropic etching process. The resulting trenches typically display a steep side-wall profile. The trenches are subsequently refilled with a dielectric, such as silicon dioxide, typically by a chemical vapor deposition ("CVD") technique. They are then planarized by an etch-back process so that the dielectric remains only in the gap, its top surface level with that of the silicon substrate. The resulting filled-trench structure functions as a device isolator having excellent planarity and potentially high aspect ratio beneficial for device isolation. Refilled trench isolation can take a variety of forms depending upon the specific application; they are generally categorized in terms of the trench dimensions: shallow trenches (<1 $\mu$m), moderate depth trenches (1 $\mu$m to 3 $\mu$m), and deep, narrow trenches (>3 $\mu$m deep, <2 $\mu$m wide). Shallow Trench Isolation (STI) is used primarily for isolating devices of the same type in increasingly dense MOS circuits. STI provides a high degree of surface planarity.

Similar isolation techniques are used to separate closely spaced circuit elements that have been formed on or above a semiconductor substrate during integrated circuit fabrication. The circuit elements may be active devices or conductors, and are isolated from each other by refilled "gaps".

The basic trench, or gap, isolation process is, however, subject to drawbacks, one of these being void formation in the gap during dielectric gap fill. Such voids are formed when the gap-filling dielectric material forms a constriction near the top of the gap, preventing deposition of the material into the gap interior. Such voids compromise device isolation, as well as the overall structural integrity. Unfortunately, preventing void formation during gap fill often places minimum size constraints on the gaps themselves, which may compromise device packing density or device isolation.

Silicon dioxide is formed by conventional CVD techniques by mixing a gaseous oxidizer (e.g., $N_2O$), silane ($SiH_4$) and inert gases, such as argon, and energizing the mixture in a reactor so that the oxygen and silane react to form silicon dioxide on a wafer substrate. Currently, plasma-enhanced chemical vapor deposition ("PECVD") processes are used to fill gaps with silicon oxide material. In PECVD processes, a plasma of ionized gas is formed in the CVD plasma reactor. The plasma energizes the reactants, enabling formation of the desired silicon dioxide at lower temperatures than would be possible by adding only heat to the reactor system. In a typical plasma-enhanced CVD ("PECVD") process, the plasma is a low pressure reactant gas discharge that is developed in a radio-frequency ("rf") field. The plasma is an electrically neutral ionized gas in which there are equal number densities of electrons and ions. At the relatively low pressures used in PECVD, the electron energies can be quite high relative to heavy particle energies. The high electron energy increases the density of dissociated reactants within the plasma available for reaction and deposition at the substrate surface. The enhanced supply of reactive free radicals in the PECVD reactor enables the deposition of dense, good quality films at lower temperatures (e.g., 400° C.) and at faster deposition rates (30 nm/min to 40 nm/min) than typically achieved using only thermally-activated CVD processes (10 nm/min to 20 nm/min).

In addition to silane ($SiH_4$), other silicon-containing precursors have been used to form silicon dioxide, including disilane ($S_2H_6$) and tetraethoxysilane ("TEOS"). All of these processes require mixing the silicon-containing reactant with an oxidizing gas reactant, such as oxygen gas ($O_2$), ozone ($O_3$), nitrous oxide ($N_2O$), nitrogen dioxide ($NO_2$) or carbon dioxide ($CO_2$).

The capacitance across a gap is governed by the formula $C=\epsilon kA/t$ where C is the capacitance, $\epsilon$ is the dielectric constant of the gap fill material, k is a constant, A is the area of the gap (i.e., the area of the side of the circuit element forming the gap), and t is the thickness or width of the gap. As gap widths decrease with increasing density, the capacitance across the dielectric gap fill material increases. Thus, as integrated circuits become increasingly dense, decreasing t, it is necessary to lower the dielectric constant of the gap fill material to reduce cross-talk, capacitive coupling and resulting speed degradation, and power consumption. To compensate for smaller gap dimensions, it is known to substitute dielectric materials having dielectric constants lower than silicon dioxide. It is known in the prior art to form halogen-doped silicon dioxide. For example, fluorinated silicon dioxide films possess a dielectric constant of approximately 3.2, whereas typical CVD-$SiO_2$ has a dielectric constant of about 3.9. It is also known to use multilayer or "sandwich" gap-fill material, including structures comprising a silicon dioxide layer and a non-silicon carbon-based layer or a polymer layer. Although these structures may possess an overall dielectric constant lower than silicon dioxide, their fabrication processes are slow, complex and expensive, and they are limited with respect to aspect ratios achieved.

Design feature widths of integrated circuit devices are currently approaching 0.25 $\mu$m, or 250 nm. To achieve corresponding overall circuit density, gap dimensions of approximately 100 nm to 400 nm gap width range and 300 nm to 1000 nm gap depth range are desired, having corresponding range of aspect ratios of 2 to 6. Furthermore, because the gap is so thin, the insulating gap material should have a dielectric constant of 3.3 or less.

A gap opening of 500 nm or less is too small for depositing material using conventional CVD and PECVD methods. Also, as the deposition of gap-filling material proceeds, the gap opening becomes smaller, making it more difficult to fill and creating the risk of void formation. Currently, high density plasma ("HDP") CVD is used to fill high aspect ratio gaps. Also, using HDP-CVD, it is usually possible to deposit silicon oxide films at lower temperatures (e.g., 150° C. to 250° C.) than in a PECVD process. Typical HDP-CVD processes use a gas mixture containing oxygen, silane, and inert gases, such as argon, to achieve simultaneous dielectric deposition and etching. In an HDP process, an rf bias is applied to a wafer substrate in a reaction chamber. Some of the gas molecules, particularly argon, are ionized in the plasma and accelerate toward the wafer surface when the rf bias is applied to the substrate. Material is thereby sputtered when the ions strike the surface.

It is known that carbon-containing silicon oxide films have lower dielectric constants than silicon oxide films. It is believed that the carbon works by decreasing the effective density of the film, since a film of zero density, that is, a vacuum, has a dielectric constant of 1. Also, carbon contained in silicon oxide films, for example, $CH_3$ groups, is usually less polarizable than silicon oxide, thereby lowering the capacitance, or dielectric constant, of the thin film.

It is known in the art to deposit a carbon-containing silicon oxide film by reacting an organic carbon-containing gaseous precursor compound, a silicon-containing gaseous precursor compound and an oxygen-containing oxidizing reactant gas ("oxidizer") in a PECVD or HDP-CVD process. The oxidizer serves to oxidize silicon atoms to form silicon oxides. The carbon-containing and the silicon-containing precursors may be the same organic precursor compound. The oxygen containing reactant gas may be oxygen gas ($O_2$), ozone ($O_3$), nitrous oxide ($N_2O$), nitrogen dioxide ($NO_2$), carbon dioxide ($CO_2$) or other oxidizer gas. During formation of the insulator film in conventional methods for forming silicon oxide films containing carbon, the reactive oxygen from the oxygen-containing reactant gas ("oxidizer") oxidizes both silicon atoms and carbon atoms. The reactive oxygen oxidizes the carbon present in both the deposited thin film and in the gaseous precursor. The products of the oxidation reaction include CO and $CO_2$, which are volatile gases that escape from the film. As a result, the deposited gap-fill film contains less carbon and has a higher dielectric constant than desired. Use of oxidizer gases less reactive than $O_2$ gas ameliorates the negative effects of carbon oxidation; yet, the problem of undesired oxidation of carbon persists.

When a carbon-containing silicon-oxide is deposited to fill narrow gaps having aspect ratios of about 1.5 or greater, the simultaneous deposition and sputtering of an HDP-CVD process is necessary in order to fill the gap. Unfortunately, however, the high frequency sputtering preferentially removes the carbon groups, such as $CH_3$, from the deposited thin film material. The reduction in carbon-content of the thin film results in increased dielectric constant, which is undesired.

Thus, there is a need for a method of depositing gap-filling insulator material for filling an insulator gap, or a trench, having an aspect ratio of 2 or greater and containing insulating material having a dielectric constant of 3.3 or less.

In particular, there is a need for a method of depositing a carbon-containing silicon oxide thin film in a narrow gap that does not reduce the carbon-content of the thin film.

SOLUTION

The invention provides a novel method for filling insulator gaps, or trenches, with low dielectric constant material. A method in accordance with the invention includes using a high-density plasma CVD ("HDP-CVD") technique to deposit dielectric insulator material in the gaps to be filled. A key, novel feature of the invention is varying the high frequency ("high F") rf bias applied to a wafer substrate during the process of filling a gap with dielectric insulator material. The rf bias may be varied by applying a pulsed rf bias or by tailoring the magnitude of the rf bias, or both. In contrast to the invention, a continuous, uniform rf bias is applied to the wafer substrate in conventional HDP-CVD processes.

To apply a pulsed bias in accordance with the invention, preferably, a bias trigger is added to the high F rf source, which bias trigger variably controls the period and length of on-time of the rf source. The bias trigger switches the high F rf bias on and off for various amounts of time. The amounts of time on and off can be constant throughout the deposition process, or they can vary throughout the deposition process. The pulse timing may be pre-set at the start of the deposition process, or it may be controlled through a monitoring and feed-back process-control system. A tailored rf bias in accordance with the invention is a high F rf bias of which the magnitude of the bias is tailored to change during the deposition process. Typically, the magnitude decreases during the deposition process so that it is the minimum power necessary to preferentially sputter-etch the deposited gap-filling dielectric material at the top of the gap to prevent the gap opening from prematurely closing and forming a void in the gap. The magnitude is typically tailored by a setting on the bias generator. In accordance with the invention, the rf bias may be varied by applying a pulsed bias, or a tailored bias, or a pulsed tailored bias.

When an HDP-CVD method in accordance with the invention is used, the high F rf bias applied to the substrate results in sputter etching of the deposited thin film by highly energized radicals and inert gas molecules of the plasma. As a result, dielectric material deposited on the wafer surface is sputter-etched, helping to keep gaps open during the deposition process. By varying the bias to minimize sputter-etching, the overall rate of deposition is increased, operating and equipment costs are lowered, and damage to the circuit elements and to the dielectric thin film is minimized. A method in accordance with the invention is especially useful for deposition of a carbon-containing silicon oxide gapfilling dielectric material. A method employing HDP-CVD is especially useful to fill isolator gaps having a gap width in the range of from 100 nm to 1000 nm and an aspect ratio in the range of from 2 to 3 or greater.

Preferably, the variable high F rf is applied to the substrate as the energized plasma is reacting and solid oxide material is being deposited on the substrate, so that sputtering and deposition occur simultaneously. Deposition and sputtering may also be conducted in sequence, however.

The reactant gas mixture in an HDP-CVD reaction chamber in accordance with the invention typically comprises a silicon-containing precursor compound and an inert plasma forming gas, such as argon. Argon is also typically used as the sputtering gas. The reactant gas mixture typically comprises an inert carrier gas that carries the organic precursor compound into the reaction chamber. Preferably the organic precursor compound contains silicon, oxygen and carbon. The reactant gas mixture also may comprise organic solvent molecules.

A method in accordance with the invention is especially useful for filling gaps with carbon-containing silicon oxide dielectric material. The carbon atoms in carbon-containing silicon oxide material are typically present in alkyl groups, such as $CH_3$-groups. The carbon-containing groups are more easily sputtered from the surface of the deposited dielectric material than silicon oxide. Thus, the carbon is preferentially removed from the dielectric material, reducing the carbon content of the carbon-containing dielectric material. As a result of varying the high F rf bias in accordance with the invention to minimize the time or the magnitude of the sputter-etching, or both, less carbon is removed from the deposited dielectric material.

In a preferred embodiment of the invention, an organic precursor compound containing silicon, carbon and oxygen reacts in a plasma-enhanced CVD process without the addition of an additional, oxygen-containing reactant gas to form a carbon-containing silicon oxide layer. In contrast with other embodiments, which add a separate oxygen-containing oxidizer gas to the reactor chamber to oxidize silicon, the preferred embodiment of a method in accordance with the invention does not comprise the addition of $O_2$ gas or $N_2O$ or other oxidizer gases to the reaction chamber or to the reactant gas mixture of the CVD process. Instead, the oxygen for forming the silicon oxide of the insulator film is provided in the organic precursor of the invention. Since the oxygen in the precursor is chemically bound with the silicon, it is relatively unreactive, compared with oxygen atoms of $O_2$, ozone, $N_2O$ and other oxidizer gases commonly used in CVD processes. As a result, a preferred embodiment of a method in accordance with the invention avoids oxidation of the carbon in the precursor and in the deposited thin film. The carbon in the thin film is chemically stable, typically in the form of carbon-containing groups, such as —$CH_3$. Since there is no reactive oxidizing gas added to the CVD reaction chamber, the only reacting oxygen comes from the precursor. The plasma oxygen concentration is lower, so volatile carbon compounds, such as $CO_2$ or CO, do not form and volatilize as much as if a reactive oxidizing gas were present. Also, since the oxygen atoms are bound, they do not react with hydrogen atoms that may be present, forming undesired OH-groups or water, which would increase the dielectric constant. A method in accordance with the invention, including varying the high F rf bias applied to the wafer substrate in an HDP-CVD reaction chamber, is especially useful to fill isolator gaps having a gap width in the range of from 100 nm to 1000 nm and an aspect ratio in the range of from 2 to 3 or greater with carbon-containing silicon oxide material having a low dielectric constant, typically less than 3.5.

Preferably, the gaseous precursor stream flowed into the CVD reactor contains an organic precursor compound comprising silicon, oxygen and carbon. In a method in accordance with the invention, the gaseous precursor stream may contain a plurality of precursor compounds and each precursor compound may contain one or several of the elements silicon, oxygen and carbon. An important feature of a method and of organic precursors in accordance with the invention, however, is that the oxygen atoms contained in the gaseous precursor are bound in a relatively unreactive form. Typically, the oxygen atoms are chemically bound to silicon in a precursor compound. A preferred precursor is octamethylcyclotetrasiloxane.

The invention, therefore, is most useful when applied to deposit a thin film of low dielectric constant, carbon-containing silicon oxide in a gap, or trench, between active devices or conductive interconnects in high density integrated circuits. A method using a pulsed bias or tailored bias in accordance with the invention is also useful, however, to deposit silicon dioxide films having conventional compositions, especially when filling gaps having extremely high aspect ratios (e.g., when the aspect ratio is up to 4). In addition to filling gaps or trenches, however, the invention may be used to deposit a premetal dielectric layer ("PMD"), an intermetal dielectric layer ("IMD"), an interlayer dielectric layer ("ILD"), a passivation layer and other insulator thin films having a low dielectric constant in an integrated circuit.

DETAILED DESCRIPTION OF THE PREFERRED EMBODIMENT

1. Overview

It should be understood that FIGS. 1–2, 4–10, depicting integrated circuit devices fabricated in accordance with the invention, are not meant to be actual plan or cross-sectional views of any particular portions of actual integrated circuit devices. In actual devices, the layers will not be as regular and the thicknesses and widths may have different proportions. The various layers in actual devices often are curved and possess overlapping edges. Furthermore, the types and structures of circuit elements in actual integrated circuits that may be electrically isolated using a gap-filling method in accordance with the invention are varied and numerous. The figures, therefore, merely show idealized representations that are employed to depict more clearly and fully the use of the invention than would otherwise be possible.

Figure 1:
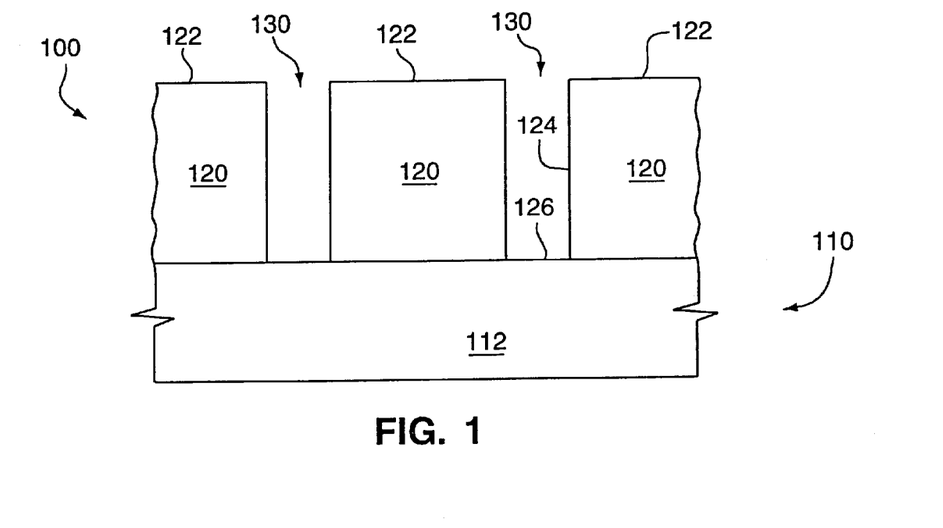
FIG. 1 is a cross-sectional view of an integrated circuit section having unfilled gaps before a method in accordance with the invention is utilized to form a carbon-containing low-dielectric constant thin film.

FIG. 1 is a cross-sectional view of an integrated circuit section 100 before a method in accordance with the invention is utilized to fill insulator gaps with a carbon-containing low-dielectric constant thin film. Section 100 includes a wafer substrate 110 comprising circuit elements 120 and underlying substrate 112, on which circuit elements 120 are located. Circuit elements 120 may be active circuit devices, such as transistors or memory capacitors. Circuit elements 120 typically are electrically conductive metal interconnects, such as interlevel local interconnects. Underlying substrate 112 may be a semiconductor substrate containing doped regions, such as transistor source or drain regions. Underlying substrate 112 may also include a plurality of layers, such as a conventional semiconductor substrate, interlayer-dielectric layers, active circuit devices, and conductive interconnects. In section 100 of FIG. 1, gaps 130 have been formed to separate circuit elements 120. Wafer substrate 110 comprises surface 126, which is the bottom of gaps 130, and surfaces 122 and 124, which are the exposed surfaces of circuit elements 120. To reduce crosstalk and parasitic capacitive coupling between circuit elements 120, and resulting speed degradation and power consumption, gaps 130 are preferably filled with carbon-containing low dielectric constant material. Gaps 130 have a gap width in the range of 100 nm to 1000 nm. In current preferred fabrication processes of the integrated circuit art, gaps 130 typically have a gap width in the range of 200 nm to 600 nm. Gaps 130 typically have a gap depth less than 1000 nm. The gap aspect ratio, that is, the ratio of gap depth to gap width, is typically in the range of 1 to 6. In current preferred fabrication processes of the integrated circuit art, the aspect ratio is in the range of 2 to 3.5.

Figure 2:
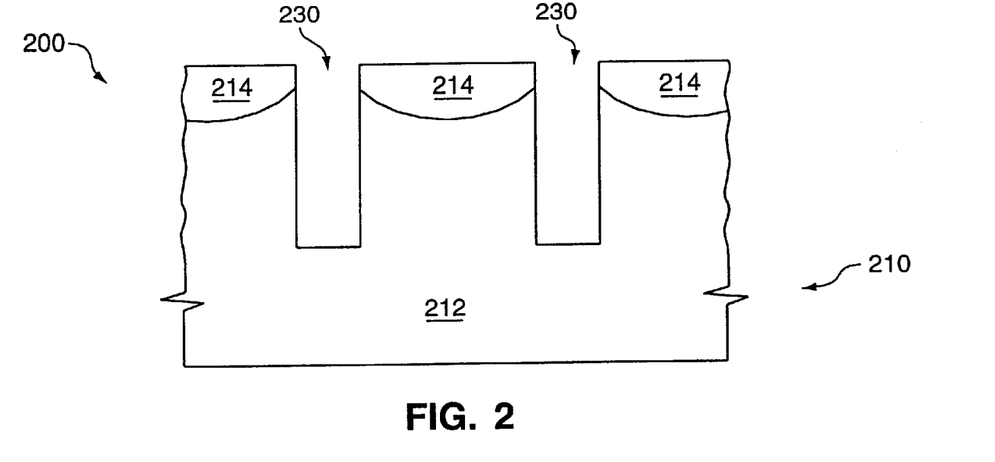
FIG. 2 depicts a cross-sectional view of an integrated circuit section 200 having unfilled trenches before the method of the invention is utilized to form a carbon-containing low-dielectric constant thin film.

FIG. 2 depicts a cross-sectional view of an integrated circuit section 200 before the method of the invention is utilized to fill insulating trenches with a carbon-containing, low-dielectric constant thin film. Section 200 includes a wafer substrate 200 comprising semiconductor substrate 212 in which circuit elements 214 have been formed. Circuit elements 214 are typically doped regions of semiconductor substrate 212, for example, source or drain regions of MOSFETs. In section 200 of FIG. 2, trenches 230 have been formed to separate circuit elements 214. To reduce cross-talk and parasitic capacitive coupling between circuit elements 214, and resulting speed degradation and power consumption, trenches 230 are filled preferably with carbon-containing, low dielectric constant material. Trenches 230 have a trench, or gap, width in the range of 100 nm to 1000 nm. In current preferred fabrication processes of the integrated circuit art, trenches 230 typically have a trench, or gap, width in the range of 200 nm to 600 nm. Trenches 230 typically have a depth less than 1000 nm. Trenches 230 may be referred to in this specification using the general term of "gaps", and the technique of filling trenches 230 is generally referred to using the term "gap-filling" and related terms. The gap aspect ratio of trenches 230, that is, the ratio of trench depth to trench width, is typically in the range of 1 to 6. In current preferred fabrication processes of the integrated circuit art, the aspect ratio is in the range of 2 to 3.5.

The word "substrate" is used ambiguously in the art. It can refer to the semiconductor material on which the integrated circuit is formed, such as semiconductor substrate 212. It may also mean any object or surface on which a material layer is directly deposited. For example, in FIG. 1, circuit elements 120 are formed on underlying substrate 112, and in FIG. 4, discussed below, dielectric material is deposited on surfaces 122, 124 and 126 of wafer substrate 110. In this disclosure, "substrate" shall mean the object or surface to which the layer of interest is applied. The term "semiconductor substrate" generally refers to the initial semiconductor material of the starting wafer and its doped regions, such as semiconductor substrate 212. In this specification, wafer 110, 210, and specifically semiconductor substrate 212, typically comprise crystalline silicon semiconductor material; but the term "semiconductor substrate" may also refer to a GaAs, SiGe or other semiconductor materials.

Terms of orientation, such as "above", "top", "upper", "below", "bottom" and "lower" herein, mean relative to the flat direction of wafer 110, 210 in FIGS. 1–2, 4–10. For example, if a second element is "above" a first element, it means it is farther from substrate 112, 212. The flat dimension of substrate 112, 212 defines a substrate plane that is considered to be a "horizontal" plane herein, and directions perpendicular to this plane are considered to be "vertical". The terms "over" and "above" do not mean that a particular structure of layer is in direct contact with an underlying layer. For example, the circuit element 120 might not necessarily contact the top surface of the semiconductor substrate contained in wafer 110 because there may be intervening layers and elements (not shown) in between. Similarly, the word "overlying" means that the overlying element is farther from the substrate than the underlying element. It may or may not be in direct contact with an underlying layer. The term "on" is often used in the specification when referring to the deposition or formation of an integrated circuit layer onto an underlying substrate or layer. In contrast to "over" and "above", the terms "on" and "onto" generally signify direct contact, as is clear in the various contexts in which they are used. The terms "lateral" or "laterally" refer to the direction of the flat plane of the thin film. In FIG. 1, the lateral direction would be the horizontal direction. The vertical direction is normal, or perpendicular, to the horizontal direction. It is clear that circuit elements and carbon-containing low dielectric constant thin films can be fabricated with varying orientations relative to the horizontal and vertical.

The term "thin film" is used herein as it is used in the integrated circuit art. Generally, it means a film of less than a micron in thickness. Preferably, the gaps filled in accordance with the invention have a width of 100 nm to 500 nm, and a depth not exceeding 1000 nm.

The term "trench", as used in the art, usually denotes a recess in a semiconductor substrate, typically formed by etching. The term "gap", as used in the art, usually refers to a spacing between circuit elements that have been formed on a wafer substrate on or above a semiconductor substrate, but it is sometimes used I(J generally to include a "trench". The method and precursors of the invention may be used virtually identically to fill both trenches and gaps. This specification usually refers to filling "gaps" in applying a method and precursors in accordance with the invention. Nevertheless, it should be understood that the invention, as described in the claims, is equally applicable forfilling trenches. In this specification, therefore, the term "gap" is used to include both trenches and gaps.

2. Detailed Description of the Method and Precursors

Figure 3:
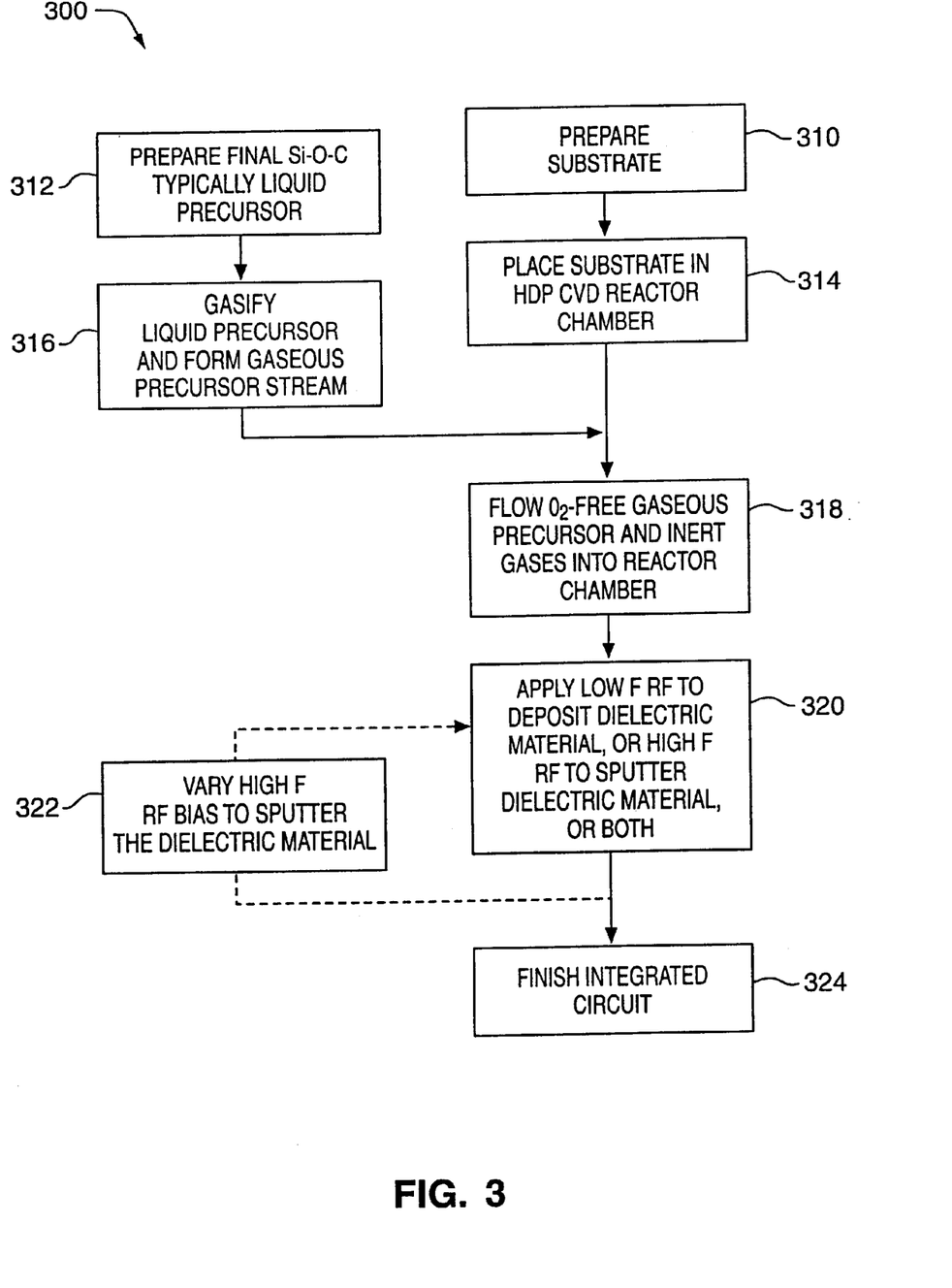
FIG. 3 is a process flow sheet of a preferred method for filling a gap with low dielectric constant, carbon-containing silicon oxide material, including varying the high frequency rf bias applied to the substrate.

FIG. 3 is a process flow sheet of a preferred HDP-CVD method 300 for filling a gap of an integrated circuit substrate with a thin film of dielectric material by varying the high F rf bias applied to the substrate. Preferably, the gap is filled with low dielectric constant, carbon-containing silicon oxide material without the use of an oxidizer. In particular, FIG. 3 depicts a flow sheet of an HDP-CVD method for filling a gap having an aspect ratio greater than 2 with carbon-containing silicon oxide material having a dielectric constant less than 3. Method 300 of FIG. 3 is described with reference to FIGS. 1, 4–9. It should be understood, however, that a method and precursors in accordance with the invention can be modified and applied to fabricate low dielectric constant insulating thin films to conform to shapes other than narrow gaps of FIGS. 1, 4–9. For example, interievel dielectric layers may be fabricated using similar precursors in a PECVD or HDP-CVD reactor.

In step 310 of FIG. 3, substrate 112 is prepared. Step 310 comprises all prior fabrication processes, including fabrication of circuit elements 120, formation of doped regions and insulating layers (not shown), and all prior annealing, pattering, etching and cleaning steps. Finally, step 310 includes formation of gaps 130 using conventional patterning and etching steps. In step 312, a final liquid precursor solution containing moieties of silicon atoms, oxygen atoms and carbon atoms is prepared. In the preferred embodiment of a method in accordance with the invention, no reactive oxygen atoms are fed into the reaction chamber, where they could react with carbon atoms, effectively removing them from the deposited thin film, or react with hydrogen, forming OH-groups or water. The oxygen atoms for providing the oxygen of the silicon oxide material in the deposited thin film are provided, therefore, in the final liquid precursor, already chemically bound to silicon atoms. The silicon and oxygen are included in an organic precursor compound. It is possible for the carbon atoms to be provided in another organic precursor compound. Nevertheless, in the preferred method, the silicon, oxygen and carbon atoms are all present in the same organic precursor compound. The preferred organic precursor compound is octamethylcyclotetrasiloxane, corresponding to the stoichiometric formula $(SiO(CH_3)_2)_4$. The organic precursor compounds may be prepared using a variety of standard conventional methods, or they may be purchased commercially.

In step 314, wafer 110 comprising substrate 112 is placed in the reaction chamber of an HDP-CVD apparatus. HDP-CVD apparati have been described in numerous publications, and most conventional apparati are suitable for carrying out the method of the invention. A preferred apparatus was described in U.S. Pat. No. 5,605,599, issued Feb. 25, 1997, to Benzing et al., which is hereby incorporated by reference as if fully contained herein. After the wafer is placed on the substrate holder, the pressure of the reaction chamber is maintained at a pressure in the range of 0.1 mTorr to 100 mTorr, preferably in the range of 5 mTorr to 15 mTorr. The temperature of the reaction chamber is maintained in the range of 0° C. to 200° C., preferably at 50° C. Argon or other plasma-forming gas is added to the reaction chamber at a flowrate in the range of 5 sccm to 100 sccm. A low frequency (low F) rf field is applied to the argon gas to form a plasma. The argon serves to maintain plasma energy.

In step 316, the liquid precursor is gasified into an inert carrier gas, typically helium. Gasification may be achieved using one or a combination of several conventional techniques, including bubbling, ultrasound, misting and heating. The gasification occurs at low pressure, corresponding to the pressure of the reaction chamber, thereby making gasification easier. The preferred method of gasification is evaporation of the precursor at reaction chamber pressures. The flow rate of liquid precursor to the gasifying stage is in the range of 0.1 ml/min to 1.5 ml/min, preferably about 0.75 m/min. The flow rate of inert carrier gas is in the range of 50 sccm to 1000 sccm, preferably about 150 sccm.

In a preferred embodiment of the invention, no oxidizing reactant gas ("oxidizer") is added to the gaseous precursor stream or the reaction chamber. Conventional prior art oxidizers are reactive oxygen compounds, such as $O_2$, $O_3$, $N_2O$, $NO_2$ and others. These reactive oxidizers used in the prior art serve to oxidize silicon, but they also oxidize carbon and whatever hydrogen may be present.

In step 318, the oxidizer-free gaseous precursor stream is fed into the reaction chamber. The gaseous precursor stream and other gases added to the reactor form the reactant gas mixture.

The low F rf source has a frequency of about 450 kHz and a power in the operating range of 200 watts to 1000 watts, preferably about 500 watts. Further, a high frequency (high F) rf source is connected to the wafer holder in order to apply an rf bias to the substrate. The high F rf source has a frequency in the range of from 8 MHz to 20 MHz, preferably 13.56 MHz, and a power in the operating range of about 500 watts to 1500 watts. The high, F rf source has an internal dc bias control that allows a regulated bias voltage at the wafer to be achieved. The preferred high F power and bias are determined by desired film properties. The key feature of the invention is that the high F rf source is variable, either by using a pulse to turn the bias on and off periodically, or by tailoring the bias magnitude to decrease it as deposition proceeds, or by both techniques.

Figure 4:
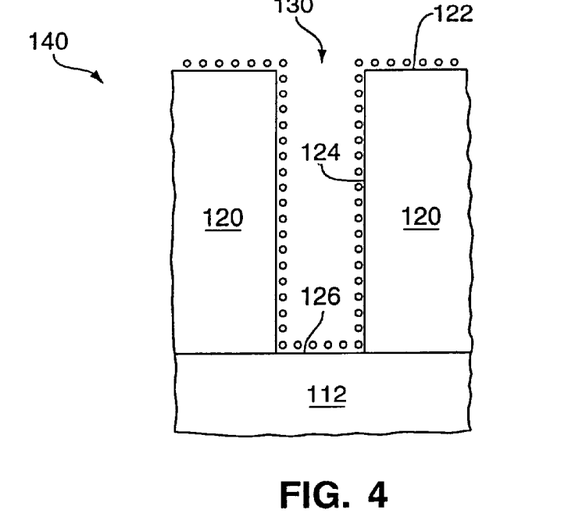
FIG. 4 is an enlarged representation of a portion of the section from FIG. 1, in which material formed in the plasma reaction deposits on all exposed surfaces of the wafer substrate.

In step 320, the low F rf field is applied to the reactant gas mixture and the resulting plasma, while the high F rf power is applied to the wafer holder. The plasma causes the organic precursor compound to dissociate into reactive radicals that react at the substrate surface, resulting in deposition of carbon-containing low dielectric constant silicon oxide material. FIG. 4 is an enlarged representation of a portion 140 of section 100 from FIG. 1. As depicted in FIG. 4, the material formed in the plasma reaction deposits on all exposed surfaces of the wafer substrate: it deposits on surfaces 124 and 126, which are the side walls and bottom, respectively, of gap 130, and it deposits on top surface 122 of circuit element 120.

A key feature of a method in accordance with the invention is that deposition and sputtering of the carbon-containing low dielectric constant silicon oxide material ("the material") occurs during the gap-filling process in the reaction chamber. The deposition and sputtering may occur either simultaneously or sequentially. When they occur simultaneously, then the high F rf bias is applied at the same time that the low F rf bias is applied to the reactant gas mixture to energize the plasma. When they occur sequentially, the precursor flow is turned off, so that deposition ceases, before the high F rf bias is applied to the substrate. Preferably, the sputtering occurs simultaneously with deposition.

Figure 5:
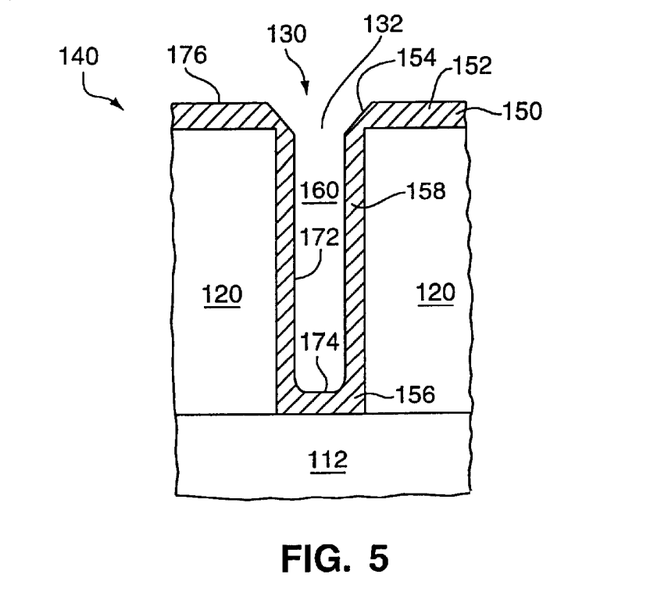
FIG. 5 depicts a further intermediate stage of deposition and sputter-etching of material onto the portion of FIG. 4, in which facets form at the corners of the circuit elements due to preferential etching, thereby preventing the gap opening from being prematurely closed off by deposited material.
Figure 6:
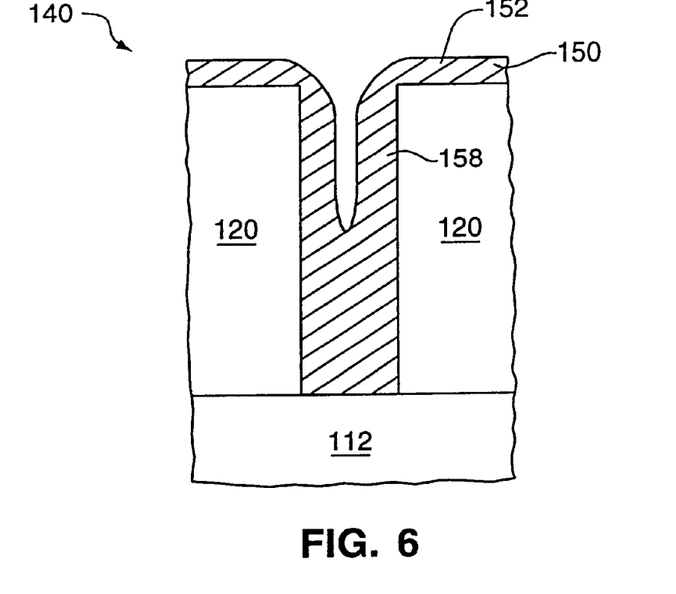
FIG. 6 depicts a further intermediate stage in the fabrication of the portion of FIG. 5, in which the gap is almost filled.

The sputtering of the material occurs as a result of the high F rf bias applied to the substrate holder. Gas molecules that have been ionized in the high density plasma, particularly argon, accelerate toward the substrate surface when the bias is applied to the substrate. Material is thereby sputter etched when the ions strike the surface. As a result, the material is sputter etched to help keep gaps open during the deposition process. This is illustrated with the aid of FIG. 5. FIG. 5 depicts a further intermediate stage of deposition of material onto portion 140. As deposition proceeds, an intermediate stage of thin film 150 of the material forms. Because the etch rate at an angle of 45° is approximately three to four times greater than the etch rate on the horizontal portion 152 of thin film 150, facets 154 form at the corbers of circuit elements 120 during the deposition process. Because of the difference in etching rates, the gap opening 132 at the top of gap 130 proximate to the corners of circuit elements 120 is not prematurely closed off by deposited material. Plasma can still penetrate into interior space 160 of gap 130 so that the thickness of bottom portion 156 and side portions 158 of thin film 150 can continue to grow to fill gap 130. Since the etch rate from side surface 172 and bottom surface 174 of thin film 150 lining interior space 160 of gap 130 is slower than at top surface 176 and at facets 154, the thickness of thin film 150 in the interior of gap 130 grows relatively quickly. Also, because the line-of-sight paths for material etched from bottom surface 174 and side surfaces 172 to an adjacent surface become increasingly shorter, more and more of the material etched from these interior surfaces redeposits itself in the interior of the gap, thus filling the gap further. This progress is illustrated in FIG. 6, which depicts a further intermediate stage in the fabrication of portion 140 in which gap 130 is almost filled.

As explained above, however, preferential sputtering of carbon from the deposited dielectric thin film can cause reduced carbon content in the dielectric material, thereby increasing the dielectric constant.

By varying, in step 322, the high F rf bias applied to the substrate, the invention minimizes the amount of sputtering to which the wafer substrate is exposed. The dashed line in FIG. 3 indicates that the high F rf bias is varied, in accordance with the invention, during the course of the deposition and sputtering process. The high F rf bias may be varied according to a predetermined schedule, or it may be varied by employing monitoring and feed-back process control techniques.

Preferably, the rf bias is varied by applying it pulse-wise to the wafer. The length of time the bias is switched on and the length of time it is switched off can be controlled to accomplish just enough sputtering to keep gap opening 132 open. The on and off times are determined by the maximum thickness that can be deposited without causing the gap to begin to close. Once the maximum thickness is reached, the bias is switched on, and the corners of the gap at the facet surfaces are preferentially sputtered. The deposition rate of the dielectric material and its sputtering rate, the bias pulse on and off times, and the pulse magnitude are all interrelated and need to be optimized for each gap geometry, reactor type and desired material properties. The pulse shape can be constant throughout the deposition process, or it can be varied. The rf bias may be continuous and uniform initially, and then the pulsed bias may be started after some material has already deposited; or the bias may be applied pulse-wise at the beginning of the plasma deposition process. A pulse trigger device may be used to control the bias source. An on-off pulsing technique may be used in which the plasma deposition is halted when the high F rf bias is applied. The time periods of plasma deposition and rf bias sputtering may be for fractions of seconds to several minutes. Practically, the time periods of deposition and sputtering are each in the range of from 1 second to 100 seconds.

In an embodiment in which deposition and sputtering occur sequentially, the plasma deposition part of the process is applied for a time period in the range of 1 second to 5 seconds, while the high F rf bias is switched off; then the high F rf bias applied to the substrate is switched on for about 30 seconds to 50 seconds, while the reactive plasma deposition is halted. The cycle is repeated until the gap is filled and the desired thin film thickness is achieved.

Alternatively, the high F rf bias may be varied by tailoring the magnitude of the bias. The magnitude is in the range of from 5 kW to about zero kW. Preferably, the magnitude of the bias is decreased from about 1000 W to about zero W during the course of the deposition process. As the gap is filled, the power of the bias is decreased. Preferably, both techniques, that is, bias pulsing and bias tailoring, are used to minimize sputtering of the wafer substrate surface.

Figure 7:
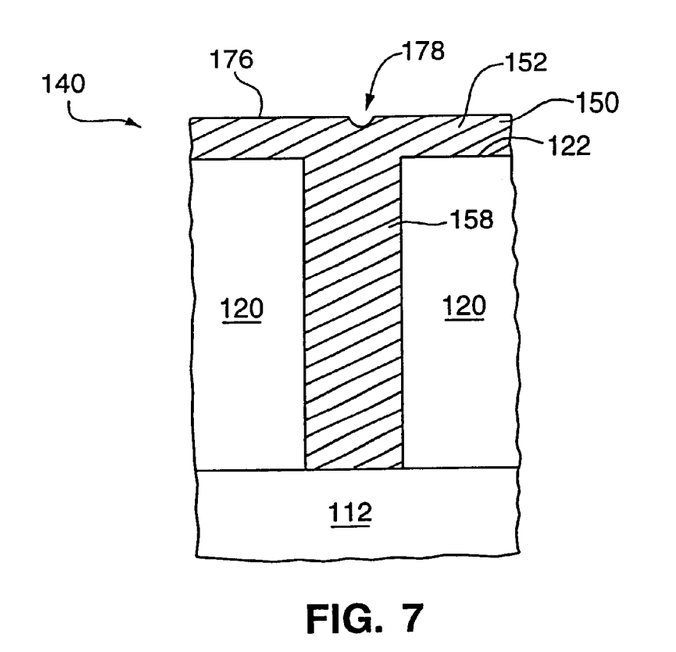
FIG. 7 depicts the portion of FIG. 6 when the HDP-CVD sputtering and etching techniques have been completed.

FIG. 7 depicts portion 140 when the HDP-CVD sputtering and etching techniques of steps 320 and 322 have been completed. Gap 130 is filled by carbon-containing, low dielectric constant silicon oxide thin film 150. Thin film 150 also covers other previously exposed top surface 122 of circuit element 120.

Figure 8:
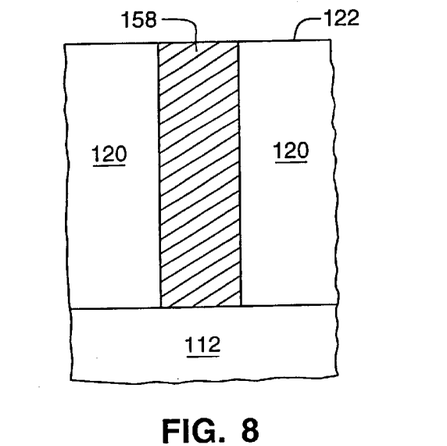
FIG. 8 shows the portion of FIG. 7 in which the horizontal portion of the deposited thin film has been removed down to the top surface of the circuit element.
Figure 9:
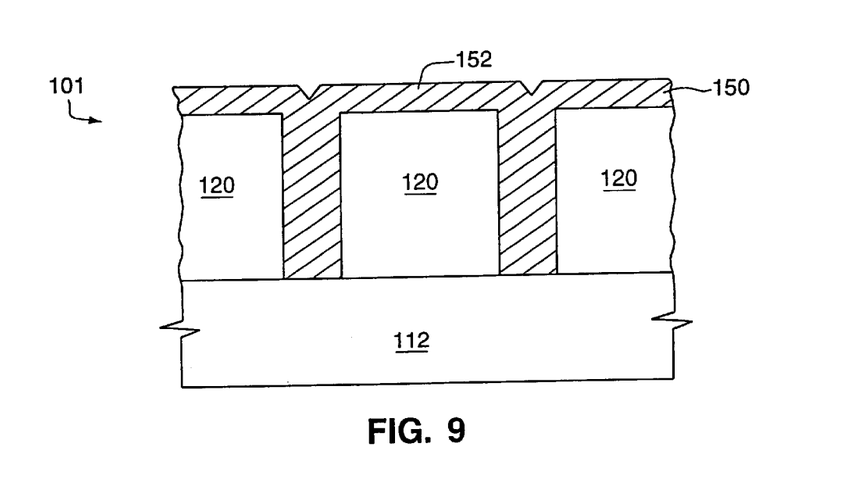
FIG. 9 shows the section from FIG. 1 in which the horizontal portion of the deposited thin film is retained so that it forms a layer between the circuit elements and overlying circuit structures (not depicted)
Figure 10:
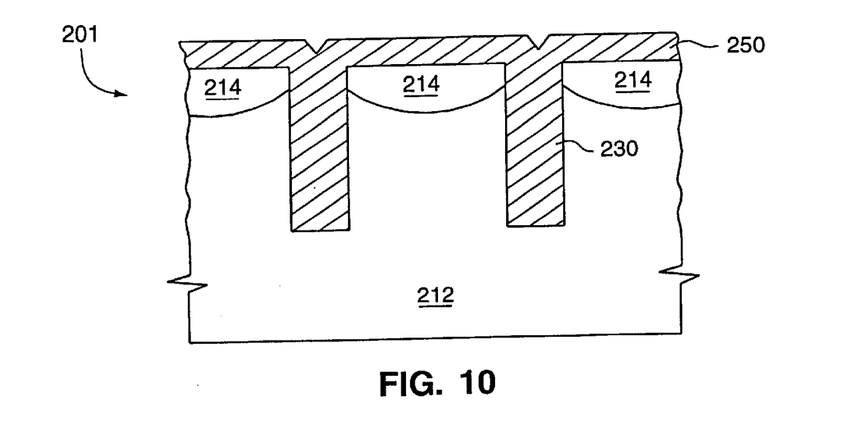
FIG. 10 shows the section in which trenches of the section of FIG. 2 have been filled using the method of the invention.

The integrated circuit is completed in steps 324, which may include re-utilization of this invention, as well as conventional steps of: adding dielectric layers, active circuit elements, and conductive interconnects; pattering, etching and annealing; and packaging. As depicted in FIGS. 7 and 8, top portion 152 may be removed completely or partially using conventional techniques to expose surface 122 of circuit element 120; or as depicted in FIG. 9, portion 152 may be retained to serve as an insulating layer in integrated circuit section 101. FIG. 10 depicts a section 201, which is a later stage of section 200 of FIG. 2, in which the invention was applied to deposit thin film 250 and fill trenches, or gaps, in semiconductor substrate 212.

Varying the high F rf bias in accordance with the invention allows deposition of carbon-containing dielectric films, particularly in high aspect ratio gaps, having a greater concentration of carbon than in films deposited using a continuous bias. Varying the high F rf bias also results in a faster net deposition rate because the amount of sputtering is reduced, thereby increasing wafer production output and efficiency. Less power is consumed, lowering operating costs. Also, less sputtering results in less plasma damage to the deposited dielectric film, to other circuit elements, and to the electrostatic chuck.

EXAMPLE 1

In a laboratory-scale embodiment of the invention, a gap with 0.24 µm opening width and an aspect ratio of 2.5 was filled with carbon-containing silicon oxide having a dielectric constant of 3.3 in the gap.

A silicon substrate having 0.24 µm features was placed in the HDP-CVD reaction chamber. A liquid precursor comprising octamethylcyclotetrasiloxane, corresponding to the stoichiometric formula $(SiO(CH_3)_2)_4$, was gasified at a rate of 0.75 ml/min into helium carrier gas having a flowrate of 150 sccm. The gaseous precursor stream was fed into the reaction chamber, which had a pressure of approximately 10 mTorr. The silicon substrate wafer was clamped and cooled with hydrogen gas to maintain a temperature during deposition of 200° C. Argon gas at a flowrate of 30 sccm was fed into the reaction chamber. Low F rf bias at 500 watts was applied at all times to the reaction chamber to form a plasma. The gaseous precursor was delivered in the reaction chamber for about three seconds to deposit carbon-containing silicon dioxide in the gaps and on the substrate. Then, during the next seven seconds, the precursor chemistry was cleared from the reaction chamber, but the low F rf bias and the argon flow of 30 sccm were maintained. A high F rf bias of 1000 watts was switched on for about 40 seconds to sputter the thin film. The cycle was repeated until the gap was filled and the desired thin film thickness achieved. The dielectric constant in the filled gaps was 3.3.

There has been described a novel method for depositing dielectric thin films in integrated circuits. A method in accordance with the invention is particularly useful for filling gaps having high aspect ratios with carbon-containing low dielectric constant silicon oxide material. The novel method uses high density plasma chemical vapor deposition techniques, in which a plasma is produced from a gaseous precursor mixture and reacts at the surface of an integrated circuit wafer substrate. It should be understood that the particular embodiments shown in the drawings and described within this specification are for purposes of example and should not be construed to limit the invention, which will be described in the claims below. For example, the invention contemplates that the high F rf bias may be varied in many ways not specifically described in order to reduce the amount of carbon removal or to reduce the overall amount of sputtering at the substrate surface. Similarly, carbon-containing silicon oxide thin films and other dielectric films may comprise materials of various compositions and thicknesses. It is evident that those skilled in the art may now make numerous uses and modifications of the specific embodiments described, without departing from the inventive concepts. It is also evident that the steps recited may, in some instances, be performed in a different order; or equivalent structures and processes may be substituted for the structures and processes described. Consequently, the invention is to be construed as embracing each and every novel feature and novel combination of features present in and/or possessed by the fabrication methods and compositions described.

What is claimed is:

1. A method for filling a gap with dielectric material during integrated circuit fabrication, comprising:
   providing a substrate containing said gap in a reaction chamber;
   providing an oxidizer-free reactant gas mixture in said reaction chamber, wherein said reactant gas mixture comprises moieties of silicon atoms, oxygen atoms and carbon atoms, said oxygen atoms being chemically bonded to said silicon atoms;
   applying a variable high frequency rf bias to said substrate; and
   varying said variable high frequency rf bias.

2. A method as in claim 1 wherein said variable high frequency rf bias has a frequency in the range from 8 MHz to 20 MHz.

3. A method as in claim 1 wherein said varying of said variable high frequency rf bias comprises applying said variable high frequency rf bias as a pulse, wherein said bias is switched on for a length of time and switched off for a length of time.

4. A method as in claim 3 wherein said bias is switched on for a length of time in the range of from 1 second to 100 seconds.

5. A method as in claim 3 wherein said bias is switched on for a length of time in the range of from 30 seconds to 50 seconds.

6. A method as in claim 3 wherein said bias is switched off for a length of time in the range of from 1 second to 20 seconds.

7. A method as in claim 3 wherein said bias is switched off for a length of time in the range of from 1 second to 5 seconds.

8. A method as in claim 1 wherein said variable high frequency rf bias has a variable magnitude, and said varying of said variable high frequency rf bias comprises tailoring said variable high frequency rf bias by varying said magnitude of said bias.

9. A method as in claim 8 wherein said variable magnitude is variable in the range of from 5 kW to zero kW.

10. A method as in claim 9 wherein said varying of said magnitude comprises decreasing said magnitude from 1000 watts to zero watts.

11. A method as in claim 1 wherein said dielectric material comprises carbon and a silicon oxide.

12. A method as in claim 1 wherein said dielectric material has a dielectric constant less than the dielectric constant of silicon dioxide.

13. A method as in claim 1 wherein said dielectric material has a dielectric constant less than 4.

14. A method as in claim 1 wherein said dielectric material has a dielectric constant less than 3.5.

15. A method as in claim 1 wherein said dielectric material has a dielectric constant less than 3.

16. A method as in claim 1 wherein said gap is a trench formed in a semiconductor substrate.

17. A method as in claim 1 wherein said substrate comprises integrated circuit elements, and said gap is disposed between said circuit elements.

18. A method as in claim 1 wherein said gap has an aspect ratio in the range of from 2 to 6.

19. A method as in claim 18 wherein said gap has a gap width in the range of from 100 nm to 1000 nm.

20. A method as in claim 1 wherein said reactant gas mixture comprises an organic precursor compound, said organic precursor compound containing a silicon atom and an oxygen atom chemically bonded to said silicon atom.

21. A method as in claim 20 wherein said organic precursor compound contains a carbon atom.

22. A method as in claim 21 wherein said carbon atom is part of an alkyl group.

23. A method as in claim 22 wherein said organic precursor compound is octamethylcyclotetrasiloxane, corresponding to the stoichiometric formula $(SiO(CH_3)_2)_4$.

24. A method as in claim 20 wherein said reactant gas mixture comprises an inert gas.

25. A method as in claim 24 wherein said inert gas is selected from the group consisting of argon and helium.

26. A method as in claim 20, further comprising forming a plasma in said reaction chamber from said reactant gas mixture, wherein said forming said plasma includes applying a low-frequency radio frequency to said reactant gas mixture.

27. A method as in claim 26 wherein said plasma in said reaction chamber is at a pressure in the range of from 0.1 mTorr to 50 mTorr.

28. A method as in claim 26 wherein said plasma in said reaction chamber is at a pressure in the range of from 5 mTorr to 10 mTorr.

29. A method as in claim 1 wherein said step of applying a high frequency radio frequency to said substrate results in sputter etching of said dielectric material.

* * * * *

UNITED STATES PATENT AND TRADEMARK OFFICE
CERTIFICATE OF CORRECTION

PATENT NO.     : 6,376,391 B1  
DATED          : April 23, 2002  
INVENTOR(S)    : Darin Scott Olson et al.

It is certified that error appears in the above-identified patent and that said Letters Patent is hereby corrected as shown below:

<u>Title page,</u>
Item [73], insert the following:
-- [73] Assignee:    Novellus Systems, Inc., San Jose, Calif. --

Signed and Sealed this

Tenth Day of September, 2002

*Attest:*

*Attesting Officer*

JAMES E. ROGAN  
*Director of the United States Patent and Trademark Office*